United States Patent [19]

Togari

[11] Patent Number: 4,508,979

[45] Date of Patent: Apr. 2, 1985

[54] SINGLE-ENDED PUSH-PULL CIRCUIT HAVING A SMALL THROUGH-CURRENT

[75] Inventor: Hisashi Togari, Tokyo, Japan

[73] Assignee: Nippon Electric Co., Ltd., Tokyo, Japan

[21] Appl. No.: 364,335

[22] Filed: Apr. 1, 1982

[30] Foreign Application Priority Data

Apr. 1, 1981 [JP] Japan .................. 56-48775

[51] Int. Cl.³ .................. H03K 5/13; H03K 3/01
[52] U.S. Cl. .................. 307/513; 307/270; 307/297; 307/456
[58] Field of Search .................. 307/456, 270, 317 A, 307/513, 297; 330/262, 267

[56] References Cited

U.S. PATENT DOCUMENTS

| | | | |
|---|---|---|---|
| 3,564,281 | 2/1971 | Tokunaga | 307/456 |
| 3,914,628 | 10/1975 | Pao et al. | 307/456 |
| 3,934,157 | 1/1976 | Evans | 307/456 |
| 4,045,689 | 8/1977 | Tietz | 307/456 |
| 4,322,640 | 3/1982 | Fukushima et al. | 307/456 |

Primary Examiner—Stanley D. Miller
Assistant Examiner—B. P. Davis
Attorney, Agent, or Firm—Sughrue, Mion, Zinn, Macpeak, and Seas

[57] ABSTRACT

The present invention relates to a single-ended push-pull type inverter. Such inverter in the prior art generated a large through-current flowing through series-connected output transistors. This large through-current caused not only a large power consumption but also an instability of the entire circuit including the inverter. The present invention improves these disadvantages by inserting a phase inverter stage having a current regulating function just before the output transistors and includes a first transistor having a base receiving an input signal, the phase inverter stage having an input end connected to the collector of the first transistor, a second and a third transistor connected in series, the bases of the second and third transistors being electrically connected, respectively, to the collector of the first transistor and output end of the phase inverter stage and an output terminal connected to the circuit portion connecting the second and third transistors.

11 Claims, 17 Drawing Figures a INPUT SIGNAL $V_{IN}$ AT THE TERMINAL 1 b OUTPUT SIGNAL $V_{CQ1}$ AT COLLECTOR OF Q1 c OUTPUT SIGNAL $V_{EQ1}$ AT EMITTER OF Q1 d VOLTAGE OF POWER SUPPLY $V_{CC}$ a INPUT SIGNAL $V_{IN}$ AT THE TERMINAL 1 b OUTPUT SIGNAL $V_{OUT}$ AT THE TERMINAL 2 c $V_{CC}$ / GND

SINGLE-ENDED PUSH-PULL CIRCUIT HAVING A SMALL THROUGH-CURRENT

BACKGROUND OF THE INVENTION

The present invention relates to a single-ended push-pull circuit (hereinafter referred to as SEPP circuit) and, more particularly, to an SEPP circuit suited as an inverter.

SEPP circuits have been widely used in logic and linear circuits. Particularly, such circuits are successfully applied in inverters used for level conversion or for driving an external load. In inverters used for these purposes, it must be taken into consideration that the power consumed at the time of change in output level should be small and that the inversion operation should not result in instability of other circuits driven by the same power source in addition to the basic requirement that the output satisfies the required output voltage level and changes rapidly.

There has been widely known a circuit formed of an input transistor receiving an input signal at its base, a first output transistor having a base connected to the collector of the input transistor, a second output transistor having a base connected to the emitter of the input transistor, and a circuit portion connecting the emitter of the first output transistor and the collector of the second output transistor to an output terminal. The collector-emitter paths of the first and second output transistors are connected in series. While the second output transistor receives a signal having a same phase as the input signal, the first output transistor receives the input signal after inversion by the input transistor. Thus, in theoretical operation, the first and second output transistors turn on and off, or off and on, respectively, at the same time. However, in practice, a transistor has a delay time for switching its operational condition. Due to this delay time, after the polarity of the input signal changes, there is a time duration when both of the output transistors keep their on-state causing flow of so-called "through-current" through the emitter-collector paths of both output transistors. This results in lowering of the voltage of the power source. This through-current results in not only an increment of power consumption but also in instability of the circuit operation of other circuits driven by the same power source.

SUMMARY OF THE INVENTION

It is therefore an object of the present invention to provide an inverter using an SEPP circuit which produces little through-current.

It is still another object of the present invention to provide an inverter using an SEPP circuit which consumes little power at change in output level and the operation of which does not affect the operation of other circuits driven by the same power source.

It is another object of the present invention to provide an improved SEPP circuit suitable for an inverter.

An SEPP circuit according to the present invention has an input terminal and an output terminal. An input signal is applied to a first transistor through the input terminal. The output from the first transistor is applied to an input end of a phase inverter stage having an output and a common end. The output from the first transistor is also applied to a second transistor, and the signal at the output end of the phase inverter stage is supplied to a third transistor. The second and third transistors have their collector-emitter paths connected in series to effect a push-pull circuit operation. The output terminal is coupled to the circuit part interconnecting the second and third transistors.

The phase inverter stage includes a fourth transistor having base and collector connected respectively to the input and output ends, and a resistive element connected between the common end and the emitter of the fourth transistor. The collector current of the fourth transistor is restricted by the resistive element, and therefore the phase inverter stage has a current regulating function for regulating the current flowing therethrough to reduce its switching delay.

Favorably, a diode is connected between the output end of the first transistor and the input end of the second transistor, and the common end of the phase inverter stage is connected to the input end of the second transistor. Therefor, the difference is forward voltage drops between the diode and the base-emitter diode of the fourth transistor is applied between the both ends of the resistive element. Since values of the forward voltage drops are constant, a constant current flows through the resistive element and the collector current of the fourth transistor is determined by the resistavce value of the resistive element and the constant voltage difference. In other words, regulating the collector current of the fourth transistor becomes earily, and further desired current value is obtained.

According to the present invention, the output from the first transistor is applied to the second transistor with substantial no time delay, and is further applied to the third transistor via the plase inverter stage with phase inverted and with a sligh time delay. Therefore, the approximately simultaneous changes in operating states of the second and third transistors are attained, thereby producing a remarkable reduced through-current.

As mentioned above, the SEPP circuit of the present invention reduces the through-current extremely. This contributes to elimination of the large change in voltage of the power supply. Further, due to this stabilization of the power supply voltage, operation of the SEPP according to the present invention does not affect the operation of other circuits driven by the same power supply.

Further, difference in the threshold voltages of the second and third transistors is unavoidable. If such difference exists in an SEPP circuit, the through-current cannot be prevented by a phase inverter stage without the current regulating function. The resistive element in the phase inverter stage controls the switching time of the fourth transistor by adjusting its resistance value. Thus, the switching time of the third transistor can be controlled by the resistance element to compensate for the difference in threshold voltages of the second and third transistors. In other words, even if the threshold voltages of the second and third transistors are different from each other, the through-current can be substantially eliminated by adjusting the resistance value of the resistive element.

BRIEF DESCRIPTION OF THE DRAWINGS

The above and further objectives, features and advantages of the present invention will become more apparent from the following detailed description of embodiments taken in conjunction with the accompanying drawings.

DESCRIPTION OF THE PRIOR ART

One example of the inverter in the prior art will be described in more detail with reference to FIG. 1. An input signal $V_{IN}$ is applied to an input terminal 1 which is connected via a resistor $R_1$ to a base of a transistor $Q_1$. The transistor $Q_1$ has an emitter grounded through a resistor $R_3$ and a collector connected via a resistor $R_2$ to a power supply 3 (having a voltage $V_{CC}$). Also, the collector and emitter of the transistor $Q_1$ are connected to bases of a transistor $Q_2$ and a transistor $Q_3$, respectively. The collector of the transistor $Q_2$ is connected via a resistor $R_4$ to the power supply 3. The emitter of the transistor $Q_3$ is grounded. The emitter of the transistor $Q_2$ and the collector of the transistor $Q_3$ are connected in common to an output terminal 2.

When a high level signal is applied as the input signal $V_{IN}$ to the input terminal 1, the transistor $Q_1$ becomes conducting. Hence, the transistor $Q_2$ is turned OFF, while the transistor $Q_3$ is turned ON, and thereby a low level signal can be obtained as an output signal $V_{OUT}$ at the output terminal 2. On the other hand, when a low level signal is applied as the input signal $V_{IN}$, the transistor $Q_1$ is turned ON. Hence, the transistor $Q_2$ is turned ON and the transistor $Q_3$ is turned OFF, so that a high level signal can be obtained as the output signal $V_{OUT}$ at the output terminal 2.

Figure 2:
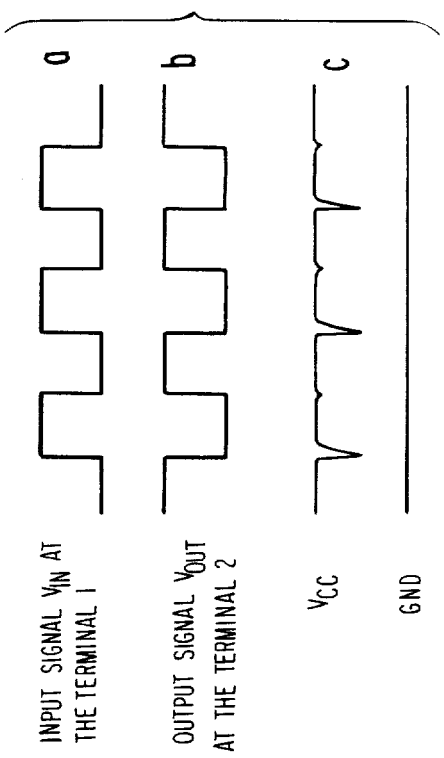
FIGS. 2(a), 2(b) and 2(c) are waveform diagrams which show an input signal, an output signal and a power supply voltage in the circuit shown in FIG. 1.

Thus, as shown in FIGS. 2(a), 2(b) and 2(c), in response to an input signal $V_{IN}$ applied to the input terminal 1 (FIG. 2(a)), an output signal $V_{OUT}$ (FIG. 2(b)) that is an inversion of the input signal $V_{IN}$ is derived from the output terminal 2. In this instance, due to delay in switching of the transistor $Q_1$, during the ON period of the transistor $Q_2$ there exists a certain time interval when the transistor $Q_1$ is still ON. As a result, the aforementioned through-current flows momentarily, thereby generating a voltage drop in the power supply voltage $V_{CC}$ (FIG. 2(c)).

Figure 3:
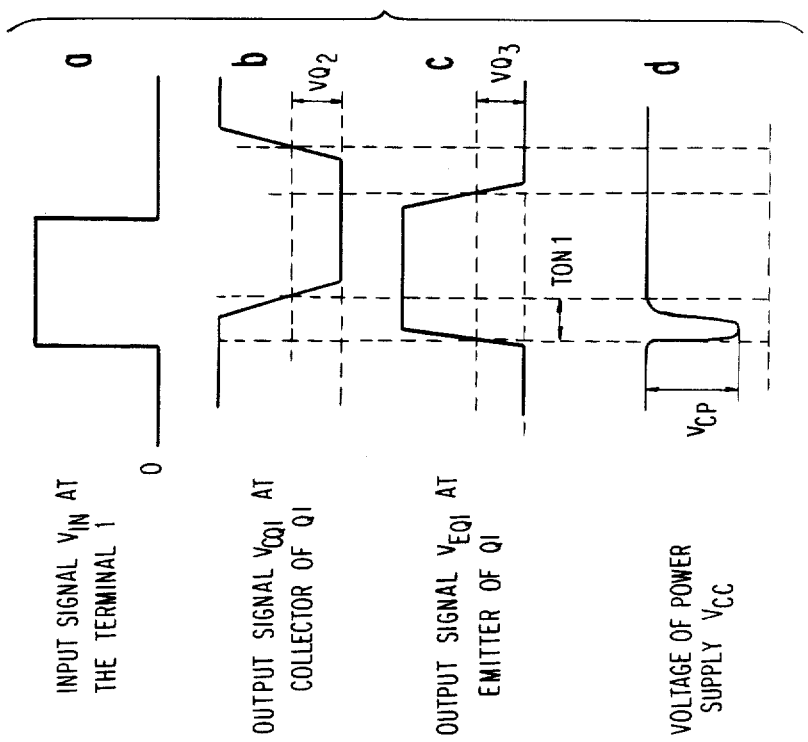
FIGS. 3(a), 3(b), 3(c) and 3(d) are voltage waveform diagrams which explain the shortcoming possessed by the circuit shown in FIG. 1.
Figure 1:
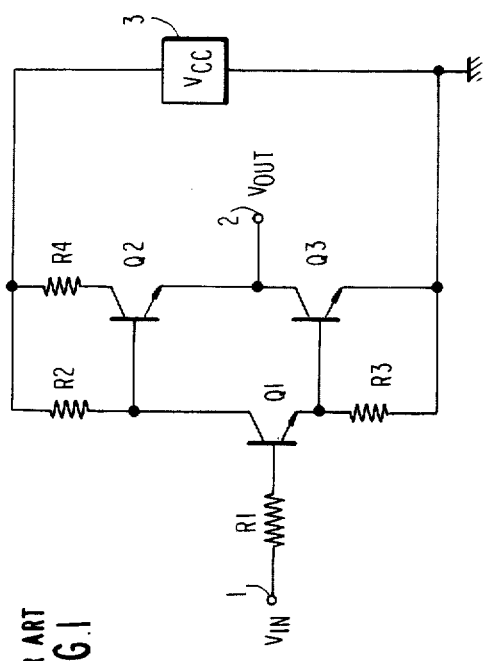
FIG. 1 is a circuit diagram which show an inverter circuit of the prior art.

FIGS. 3(a) to 3(d) illustrate signal waveforms at various points in the circuit of FIG. 1 for explaining the through-current in greater detail. When an input signal $V_{IN}$ having the waveform shown in FIG. 3(a) is applied to the input terminal 1, a signal $V_{CQ1}$ having a delay corresponding to a switching time possessed by the transistor $Q_1$ is produced at the collector of the transistor $Q_1$ as shown in FIG. 3(b). This signal $V_{CQ1}$ is applied to the base of the transistor $Q_2$. This delay is proportional to the quantity of electric charge stored in the collector of the transistor $Q_1$. On the other hand, at the emitter of the transistor $Q_1$ is produced a signal $V_{EQ1}$ having approximately the same waveform as the input signal $V_{IN}$ and having little delay time as shown in FIG. 3(c). This signal $V_{EQ1}$ is applied to the base of the transistor $Q_3$.

When no input signal or low level of the input signal $V_{IN}$ is applied to the input terminal 1, while a current flows into the base of the transistor $Q_2$ through the resistor $R_2$ to turn the transistor $Q_2$ on, the base of the transistor $Q_3$ receives no current to turn off. Thus, at the output terminal 2, a high level output signal $V_{OUT}$ is produced. In response to a rise of the input signal $V_{IN}$, the emitter voltage $V_{EQ1}$ of the transistor $Q_1$ rises quickly as shown in FIG. 3(c). When the emitter voltage $V_{EQ1}$ reaches the threshold voltage $V_{Q3}$ of the transistor $Q_3$, the transistor $Q_3$ turns on. However, the collector voltage $V_{CQ1}$ of the transistor $Q_1$ lowers after some delay time, as shown in FIG. 3(b). When the collector voltage $V_{CQ1}$ reaches the threshold voltage $V_{Q2}$, the transistor $Q_2$ turns off. As a result, there exists a time duration $T_{ON1}$ when both the transistors $Q_2$ and $Q_3$ turn on. In the time duration $T_{ON1}$, a large through-current $I_{CP}$ flows through the transistors $Q_2$ and $Q_3$ from the power supply 3. The value of the through-current $I_{CP}$ is represented by the following equation:

$$ICP = \frac{V_{CC}}{R_{SCQ2} + R_{SCQ3} + R_4 + R_{CC}} \quad (1)$$

where $R_{SCQ2}$ and $R_{SCQ3}$ represent saturated resistances of the transistors $Q_2$ and $Q_3$, respectively, $R_4$ represents the resistance value of the resistor $R_4$, and $R_{CC}$ represents the internal resistance of the power supply.

This through-current $I_{CP}$ makes the power consumption large. Further, due to this through-current $I_{CP}$, a voltage drop $V_{CP}$ determined by the internal impedance of the power supply 3 is produced in the power supply voltage $V_{CC}$ as shown in FIG. 3(d). This voltage drop $V_{CP}$ affects various circuits driven by the same power supply 3 such that it is applied to the various circuits as a parasitic signal and results in oscillation, and therefore, the above-described inverter in the prior art has shortcomings that the entire circuit including the inverter becomes unstable.

In order to obviate the above-mentioned shortcomings, it will be conceived to reduce the delay time in the collector output $V_{CQ1}$ of the transistor $Q_1$ shown in FIG. 3(b) or to lower the through-current $I_{CP}$. The lowering of the through-current $I_{CP}$ can be achieved by increasing the resistance of the resistor $R_4$ or the saturated resistances $R_{SCQ2}$ and $R_{SCQ3}$ of the transistors $Q_2$ and $Q_3$ according to Equation (1). However, increase of the resistance of the resistor $R_4$ or the saturated resistances $R_{SCQ2}$ and $R_{SCQ3}$ results in an increase of voltage drop across the respective resistor or transistor. Consequently, the output signal $V_{OUT}$ at the output terminal 2 would be unable to swing fully up to the ground level or the $V_{CC}$ level, and so, a predetermined output level could not be realized. Moreover, since the increase of the saturated resistances $R_{SCQ2}$ and $R_{SCQ3}$ causes the output current of the transistors $Q_2$ and $Q_3$ to decrease, the load connected to the output terminal 2 cannot be fully driven. Reduction of the delay in the collector voltage $V_{CQ1}$ of the transistor $Q_1$ can be realized by decreasing the quantity of electric charge stored in the collector either by reducing collector capacitance of the transistor $Q_1$ or by reducing current flowing through the collector. However, reduction of the collector capacitance means reduction of a collector area of the transistor $Q_1$, and hence the current capacity of the transistor $Q_1$ becomes small. As a result, it becomes impossible to drive the transistor $Q_2$ to a sufficient extent, and so, the desired output signal amplitude cannot be obtained. In addition, reduction of the current flowing through the transistor $Q_1$ can be realized by increasing the resistance of the resistor $R_2$. However, since drive of the transistor $Q_2$ is effected through the resistor $R_2$, it becomes impossible to drive the transistor $Q_2$ to a sufficient extent. Moreover, as the voltage drop across the resistor $R_2$ is increased, it becomes impossible to realize a desired output signal amplitude because the high level of the output signal is determined by the voltage drop across the resistor $R_2$.

As described above, although various approaches for reducing the through-current can be conceived, so long as the circuit construction as illustrated in FIG. 1 is employed, other important electrical performance is deteriorated such that drive of the load is insufficient or a desired output signal level cannot be obtained.

DETAILED DESCRIPTION OF PREFERRED EMBODIMENTS

Figure 4:
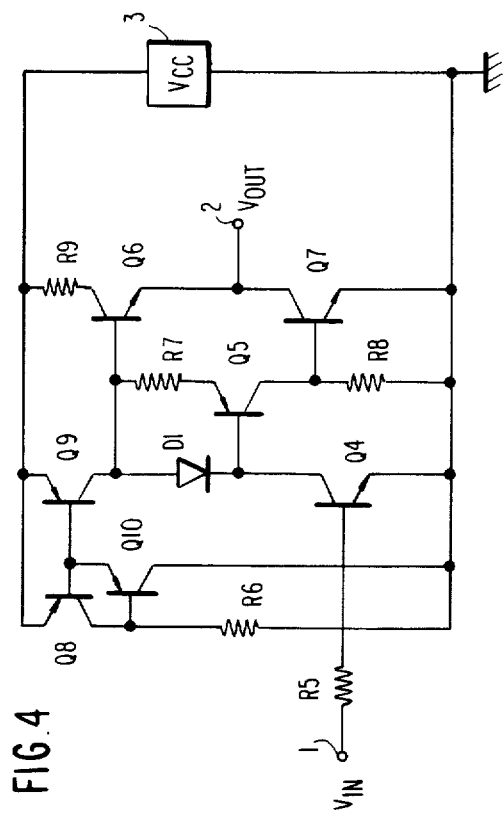
FIG. 4 is a circuit diagram of an inverter circuit according to one preferred embodiment of the present invention.

FIG. 4 is a circuit diagram of an inverter according to one preferred embodiment of the present invention. This circuit includes a first transistor $Q_4$ of NPN-type, a second transistor $Q_5$ of PNP-type, a third transistor $Q_6$ of NPN-type and a fourth transistor $Q_7$ of NPN-type. The base of the transistor $Q_4$ is connected via a resistor $R_5$ to an input terminal 1. The emitter of the transistor $Q_6$ is directly connected to the collector of the transistor $Q_7$ and to an output terminal 2. The emitter of the transistor $Q_7$ is grounded. The collector of the transistor $Q_6$ is connected via a resistor $R_9$ to a $V_{CC}$ power supply 3. Thus, the serially-connected transistors $Q_6$ and $Q_7$ form an output stage of the inverter.

In addition, the collector of the transistor $Q_4$ is connected to the base of the transistor $Q_5$ and a cathode of a diode $D_1$. The emitter of the transistor $Q_5$ is connected via a resistor $R_7$ to the base of the transistor $Q_6$ and the anode of the diode $D_1$. The anode of the diode $D_1$ is connected to the $V_{CC}$ power supply 3 through a transistor $Q_9$ which forms a constant current source in cooperation with transistors $Q_8$ and $Q_{10}$ and a resistor $R_6$. The constant current source is used for the purpose of stabilization of operation levels. The collector of the transistor $Q_5$ is connected to the base of the transistor $Q_7$ and is further connected via a resistor $R_8$ to ground.

Accordingly, the circuit shown in FIG. 4 differs from the circuit shown in FIG. 1 in that a phase inverter stage including resistor $R_7$ and second transistor $Q_5$ of PNP-type, is inserted between the collector of the first transistor $Q_4$ and the base of the fourth transistor $Q_7$. Further, the collector output of the transistor $Q_4$ is supplied through the diode $D_1$ to the base of the transistor $Q_6$. The phase inverter stage has an input end connected to the collector of the transistor $Q_4$, an output end connected to the base of the transistor $Q_7$ and a common end connected to the base of the transistor $Q_6$.

Figure 5:
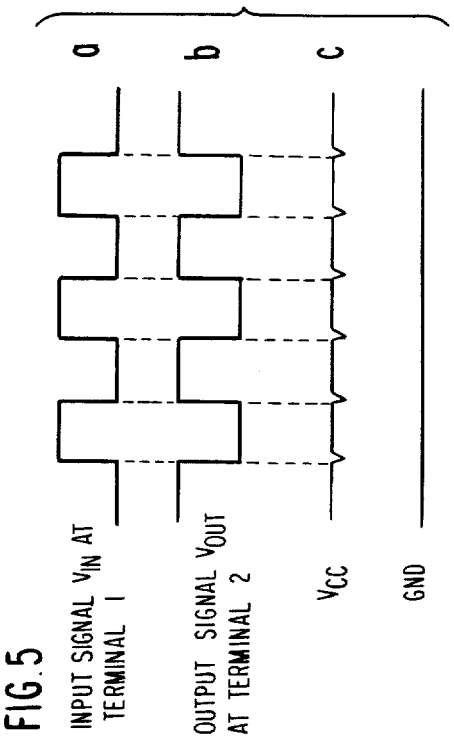
FIGS. 5(a), 5(b) and 5(c) are voltage waveform diagrams showing an input signal, an output signal and a power supply voltage of the circuit shown in FIG. 4.

Assuming now that a high level input signal $V_{IN}$ has been applied to the input terminal 1, then the transistor $Q_4$ turns ON, and hence the transistor $Q_5$ also turns ON. Accordingly, a current fed from the transistor $Q_9$ flows through the transistors $Q_4$ and $Q_5$, so that the transistor $Q_7$ turns ON. The conducting state of the transistor $Q_4$ lowers the base voltage of the transistor $Q_6$ to turn it OFF. As a result, a low level output signal $V_{OUT}$ is obtained at the output terminal 2. In the event that a low level input signal $V_{IN}$ has been applied to the input terminal 1, the transistor $Q_4$ is turned OFF, hence the transistor $Q_5$ is also turned OFF, and so, the transistor $Q_7$ is turned OFF. Since the current fed from the transistor $Q_9$ is supplied to the base of the transistor $Q_6$, this transistor $Q_6$ is turned ON. Accordingly, a high level output signal $V_{OUT}$ is obtained at the output terminal 2. In other words, as shown in FIGS. 5(a) and 5(b), an output signal $V_{OUT}$ which has an inverted waveform of the input signal $V_{IN}$ is derived from the output terminal 2. Furthermore, since generation of a large through-current does not flow through the transistors $Q_6$ and $Q_7$ as explained hereinafter, voltage fluctuation of the power supply 3 is very small as shown in FIG. 5(c).

Figure 6:
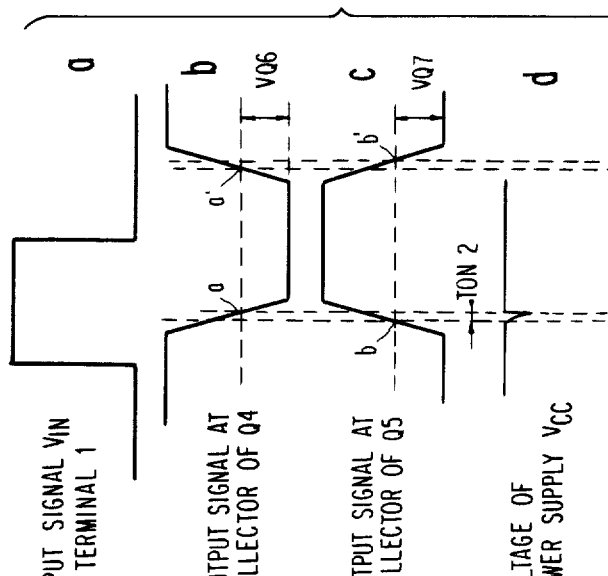
FIGS. 6(a), 6(b), 6(c) and 6(d) are voltage waveform diagrams for explaining the advantageous operation of the circuit shown in FIG. 4.

Now the circuit operation will be explained in greater detail with reference to the signal waveforms at various points in the circuit illustrated in FIG. 6.

When an input signal $V_{IN}$ as shown in FIG. 6(a) is applied from the input terminal 1 to the base of the transistor $Q_4$, the transistor $Q_4$ is turned ON and produces a collector signal $V_{CQ4}$ at the collector of the transistor $Q_4$ after some delay time corresponding to a switching time elapses, as shown in FIG. 6(b). In response to an application of the low level of this collector signal $V_{CQ4}$ to the base of the transistor $Q_6$ through the diode $D_1$, the transistor $Q_6$ turns off quickly. Simultaneously, the collector signal $V_{CQ4}$ is applied to the base of the transistor $Q_5$ to turn it on. The collector signal $V_{CQ5}$ is shown in FIG. 6(c). As a result of turning on the transistor $Q_5$, a current from its collector turns the transistor $Q_7$ on. Thus, a low level output is produced at the output terminal 2. At this time, since the transistor $Q_6$ is turned off without substantial time delay, even if a time delay appears in the collector signal $V_{CQ5}$, very little through-current flows through the transistors $Q_6$ and $Q_7$.

On the other hand, when the input signal $V_{IN}$ turns to low level, the transistor $Q_4$ turns off to raise the signal level of the collector signal $V_{CQ4}$ after some time delay, as shown in FIG. 6(b). The rise of signal level is applied to the base of the transistor $Q_6$ to turn it on. The rise of signal level is also applied to the transistor $Q_5$ to turn it off. At this time, since the collector current of the transistor $Q_5$ is restricted by the resistor $R_7$, the transistor $Q_5$ outputs its collector signal $V_{CQ5}$ with a slight time delay in comparison with the collector signal $V_{CQ4}$ of the transistor $Q_4$. Therefore, the transistor $Q_6$ turns to ON state almost simultaneously as the transistor $Q_7$ turns to OFF state. Consequently, the output signal at the output terminal 2 takes a high level, and the through-current is reduced remarkably.

In addition, although the transistors $Q_6$ and $Q_7$ change their operating states when their input signal voltage reaches their threshold voltages $V_{Q6}$ and $V_{Q7}$, these threshold voltages $V_{Q6}$ and $V_{Q7}$ are rarely made the same. If these threshold voltages $V_{Q6}$ and $V_{Q7}$ are different from each other, simultaneous switching cannot be achieved. This is shown in FIGS. 6(b) and 6(c). By the difference of the threshold voltages, while the transistor $Q_6$ turns its conductive state at the time of a and a', the transistor $Q_7$ turns at the time of b and b'. As a result, some through-current can be generated in the time duration $T_{ON2}$ as shown in FIG. 6(d).

According to the preferred embodiment shown in FIG. 4, this difference in the threshold voltage may be compensated by the resistor R7 to coincide the times a and a' with the times b and b'. More specifically, the switching voltage of the transistor Q5 can be adjusted by the resistance of the resistor R7. Since the collector signal $V_{CQ4}$ of the transistor Q4 has some inclination as shown in FIG. 6(c), the switching time of the transistor Q5 can be adjusted by the resistor R7. This fact means that the switching time of the transistor Q7 can also be adjusted. Thus, by controlling the resistance of the resistor R7, the difference in threshold voltages between the transistors Q6 and Q7 can be compensated to minimize the time duration when the through-current flows.

The resistor R7 further gives an improvement in the switching chracteristics of the transistor Q5 as described hereinbefore. As shown in FIGS. 6(b) and (c), the collector signal $V_{CQ5}$ of the transistor Q5 has very little time delay with respect to the collector signal $V_{CQ4}$ of the transistor Q4. This is due to the fact that the current flowing through the transistor Q5 is limited by the resistor R7 and thereby the electric charges stored in the collector are reduced. More particularly, the resistor R7 and the base-emitter path of the transistor Q5 form a closed loop jointly with the diode $D_1$. Accordingly, if the forward voltage of the diode $D_1$ is denoted by $V_F$, the base-emitter voltage of the transistor Q5 is denoted by $V_{BEQ5}$ and the resistance of the resistor R7 is denoted by R7, then disregarding a base current, the current flowing through the transistor Q5 is determined by the following formula:

$$\frac{V_F - V_{BEQ5}}{R_7} \quad (2)$$

Since the parameters $V_F$ and $V_{BEQ5}$ are dependent upon the semiconductor material, the current value represented by the above formula can be controlled by the resistance of the resistor R7. As a matter of course, in order that the formula (2) is valid, the PN-junction area of the diode $D_1$ is selected to be larger than the base-emitter junction area of the transistor Q5. In this embodiment, the former is four times as large as the latters. By appropriately selecting the resistance of the resistor R7, the current flowing through the transistor Q5 is preset and also the current value is held small so that the transistor Q5 stores a reduced electric charge in its collector. As a result, delay of the collector output $V_{CQ5}$ of the transistor Q5 with respect to its base input is reduced to a very small value. Since the transistor Q6 is driven by the current from the transistor Q9, the transistor Q6 is fully driven in spite of the decrease in the current through the transistor Q5. However, since the transistor Q7 is driven by the current from the transistor Q5, the current flowing through the transistor Q5 should not be too small to drive the transistor Q7. Hence, from such viewpoint, in the illustrated embodiment the resistance R7 is set at 300Ω and the current flowing through the transistor Q5 is set at 200 μA. Further, if the transistor Q7 is saturated by the current through the transistor Q5, a delay in switching of the transistor Q7 may become a problem. Therefore, the base current of the transistor Q7 is regulated by selecting the resistance of the resistor R8 at 6 KΩ. Incidentally, the resistor R favorably has a value of 200 to 450Ω from the view points of the insufficient drive and the over drive of the transistor Q7. As explained above, the inverter of the preferred embodiment minimizes through-current by a simple modification. For example, while the through-current of the inverter in the prior art shown in FIG. 1 is 12 mA, that of the embodiment shown in FIG. 4 is reduced to 2 mA by setting the resistances of the resistors R7, R8 and R9 at 300Ω, 6 KΩ and 200Ω, respectively.

Figure 7:
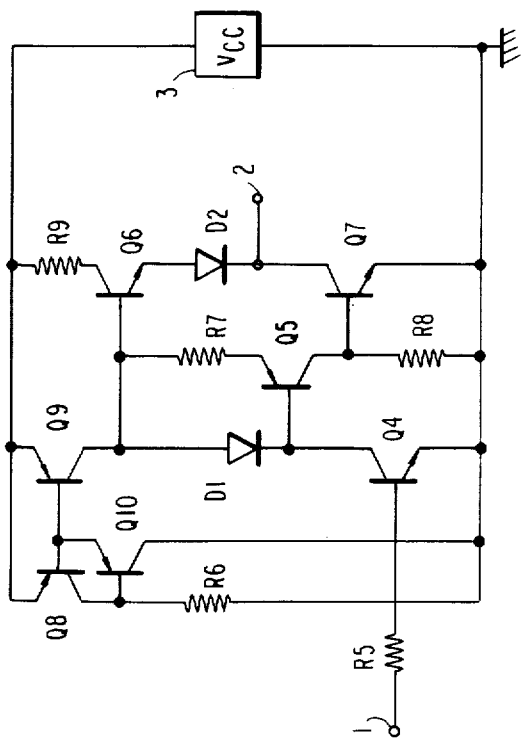
FIG. 7 is a circuit diagram of an inverter circuit according to another preferred embodiment of the present invention.

FIG. 7 is a circuit diagram of an inverter according to another preferred embodiment of the present invention.

The difference of the circuit according to this preferred embodiment from the circuit according to FIG. 4 is only that the emitter of the output transistor Q6 is not directly connected to the collector of the transistor Q7 but is connected to it through a diode $D_2$. This diode $D_2$ is inserted for the purpose of stabilizing the level at the output terminal 2. In this modified circuit also, the circuit consisting of the transistor Q5, diode $D_1$ and resistor R7 is inserted between the driver transistor Q4 and the output transistors Q6 and Q7. Therefore, the same effect as that in the circuit according to the proposed embodiment shown in FIG. 4 can be achieved.

While the above description of the present invention has been constructed by the transistors Q4, Q6 and Q7 of NPN transistors and the transistor Q5 of a PNP transistor, it is a matter of course that the present invention is equally applicable to the case where transistors of the opposite polarity type are employed.

As described in detail above, the inverter according to the present invention produces very little through-current and thereby reduces the voltage drop of the power supply voltage to a negligible value. Accordingly, power consumption can be reduced to a very small value. Moreover, an instability of a circuit including the inverter, such as oscillation, which has been caused by a large through voltage in the prior art, can be prevented. Still further, since insufficient drive for the output transistors will not occur, a desired output amplitude at a desired output signal level can be obtained for a desired load.

The present invention is not limited to only the illustrated two embodiments, but can be further modified. For instance, while a current source was constructed by a constant current source consisting of the transistors Q8-Q10 and the resistor R6, it could be replaced by a resistor connected between the diode $D_1$ and the $V_{CC}$ power supply. In this modified case, if the current flowing through the replaced resistor is excessively large, the output signal level decreased by the voltage drop across the resistor would influence the output signal level. On the contrary, if the current flowing through the replaced resistor is too small, the output transistor cannot be sufficiently driven, resulting in lowering also the output signal level. In this respect, if the constant current source as shown in FIG. 4 or 7 is employed, the above problem can be avoided. Thus, the use of the constant current source is more advantageous. The resistor R9 is provided merely for the purpose of limiting current, and in principle, it is unnecessary. Furthermore, at least one of the output transistors and other transistors may be modified into a composite transistor which combines plural number of transistors so as to operate as a single transistor, such as a Darlington connection. Still further, so long as phase relation is not disturbed, additional transistors could be inserted into the illustrated circuit. In the FIGS. 4 and 7, by replacing the transistor Q4 with the transistor of the PNP type, these modified circuits can be used as non-inverter amplifiers.

This invention has been described with respect to specific embodiments, but it will be recognized that there are modifications within the scope thereof that will be readily apparent to those of skill in the art.

What is claimed is:

1. An electronic circuit comprising a signal input terminal for receiving an input signal; a first transistor having a control electrode and first and second electrodes; means for connecting said control electrode of said first transistor to said signal input terminal; said first transistor generating at its first electrode an output signal having a phase opposite that of said input signal; a second transistor having a control electrode and first and second electrodes; means for connecting said control electrode of said second transistor to said first electrode of said first transistor; resistor means coupled between said first electrode of said second transistor and a first circuit node; a diode coupled between said first electrode of said first transistor and said first circuit node for conducting current from said first circuit node to said first electrode of said first transistor; a third transistor having a control electrode and first and second electrodes, means for connecting said control electrode of said third transistor to said first circuit node; a fourth transistor having a control electrode and first and second electrodes; means for connecting said control electrode of said fourth transistor to said second electrode of said second transistor; means for connecting said second electrode of said third transistor and said first electrode of said fourth transistor, an output terminal coupled to the connection point between the second electrode of said third and the first electrode of said fourth transistor, source means, including a power voltage terminal, for applying a source potential across said first electrode of said third transistor and said second electrode of fourth transistor, and a supply means coupled between said first circuit node and said power voltage terminal for supplying current to said first circuit node.

2. The circuit according to claim 1, in which said second transistor has a polarity opposite that of said third and fourth transistors.

3. The circuit according to claim 1, in which said supply means includes a constant current source having an output terminal coupled to said first circuit node.

4. The circuit according to claim 1, further comprising second resistor means coupled between said second electrode of said second transistor and the second electrode of said fourth transistor.

5. The circuit according to claim 3, in which said constant current source includes: a fifth transistor having a control electrode, a first electrode coupled to a power voltage terminal and a second electrode; a sixth transistor having a control electrode, a first electrode coupled to said power voltage terminal, and a second electrode coupled to said first circuit node; a seventh transistor having a control electrode connected to the second electrode of said fifth transistor, a first electrode coupled to the control electrodes of said fifth and sixth transistors, and a second electrode coupled to a reference voltage terminal; and third resistor means coupled between the second electrode of said fifth transistor and said reference voltage terminal.

6. An electronic circuit comprising: a signal input terminal for receiving an input signal; a first transistor connected to said input terminal for inverting said input signal; a second transistor having an input electrode connected to said first transistor for receiving said inverted signal, a common electrode and an output electrode; a resistor connected at one end with said common electrode of said second transistor, a forward-biased diode connected between the other end of said resistor and said input electrode of said second transistor; a third transistor having a base, emitter and collector and receiving at its base said inverted signal through said forward-biased diode; a fourth transistor having an emitter, base and collector and receiving at its base the signal from said output electrode of said second transistor, emitter-collector current paths of said third and fourth transistors being connected in series, power supply means connected across the series connection of said emitter-collector paths of said third and fourth transistors, and a signal output terminal connected to said series connection path between said third and fourth transistors.

7. The circuit according to claim 6, wherein said second transistor has a polarity opposite to that of said third and fourth transistors.

8. An electronic circuit comprising: signal input means; a phase inverter transistor having a base electrically connected to said signal input means, an emitter and a collector; a resistor connected at one end with said emitter of said phase inverter transistor; a diode connected between said base of said phase inverter transistor and the other end of said resistor, said diode being forward biased to generate a constant voltage thereacross; a first transistor having a base connected to said signal input means through said diode, an emitter and a collector; a second transistor having a base connected to said collector of said phase inverter transistor, an emitter and a collector; a means for connecting said collector of said second transistor to said emitter of said first transistor; means for coupling a supply voltage across said collector of said first transistor and said emitter of said second transistor; and a signal output means connected to the connecting means.

9. The circuit according to claim 8, wherein said connecting means includes an additional diode inserted between the emitter of said first transistor and signal output means.

10. The circuit according to claim 8, wherein said first and second transistors have a polarity opposite to that of said phase inverter transistor.

11. The circuit according to claim 8, 9 or 10, wherein said signal input means receives a logic signal.

* * * * *

UNITED STATES PATENT AND TRADEMARK OFFICE
CERTIFICATE OF CORRECTION

PATENT NO. : 4,508,979

DATED : April 2, 1985

INVENTOR(S) : Togari HISASHI, Tokyo Japan

It is certified that error appears in the above-identified patent and that said Letters Patent is hereby corrected as shown below:

Column 2, line 18, "is" should be --in--;
          line 24, "resistavce" should be --resistance--;
          line 29, "earily" should be --easy--;
          line 32, "substantial" should be --substantially--;
          line 33, "plase" should be --phase--;
          line 34, "sligh" should be --slight--;
          line 37, "remarkable" should be --remarkably--;
          line 47, insert --a-- after --Further,--.
Column 3, line 1, "show" should be --shows--.
Column 4, line 48, delete "will be conceived" and insert --would be desirable--;
          line 56, insert --the-- after "of";
Column 6, line 40, insert an --a-- after "to";
          line 50, insert --an-- after "to";
          line 52, insert --an-- after "to";
Column 7, line 14, "chracteristics" should be --characteristic--;
          line 41, "latters" should be --latter--;
Column 8, line 59, insert an --a-- before "plural";
          line 61, insert --the-- before "phase".

Signed and Sealed this

Seventeenth Day of September 1985

[SEAL]

Attest:

DONALD J. QUIGG

Attesting Officer

Commissioner of Patents and
Trademarks—Designate